United States Patent
Kawano et al.

(10) Patent No.: US 9,502,175 B2
(45) Date of Patent: *Nov. 22, 2016

(54) CIRCUIT DEVICE

(71) Applicant: Renesas Electronics Corporation, Kawasaki-shi (JP)

(72) Inventors: Masaya Kawano, Kanagawa (JP); Yasutaka Nakashiba, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 198 days.

This patent is subject to a terminal disclaimer.

(21) Appl. No.: 14/339,414

(22) Filed: Jul. 23, 2014

(65) Prior Publication Data

US 2014/0333149 A1    Nov. 13, 2014

Related U.S. Application Data

(60) Division of application No. 13/306,302, filed on Nov. 29, 2011, now Pat. No. 8,830,694, which is a continuation of application No. 12/457,295, filed on Jun. 5, 2009, now Pat. No. 8,085,549.

(30) Foreign Application Priority Data

Jul. 3, 2008 (JP) .................... 2008-174111

(51) Int. Cl.
  *H05K 1/16* (2006.01)
  *H01F 38/14* (2006.01)
  *H01F 17/00* (2006.01)

(52) U.S. Cl.
  CPC ........... *H01F 38/14* (2013.01); *H01F 17/0013* (2013.01); *H01F 2017/0086* (2013.01);
  (Continued)

(58) Field of Classification Search
  CPC ............... H01F 38/14; H01F 17/0013; H01F 2017/0086; H01F 2038/143; H01L 2224/4813; H01L 2224/48137; H01L 2924/30107; H01L 2924/00; H01L 2924/00014; H01L 2224/45099
  USPC ....... 361/761, 763, 765, 769, 782, 807, 809, 361/811, 821, 777, 778; 174/261; 336/200, 336/205
  See application file for complete search history.

(56) References Cited

U.S. PATENT DOCUMENTS 4,888,568 A * 12/1989 Kawaguchi .......... H03H 7/0115
                                                              333/172
5,357,227 A    10/1994 Tonegawa et al.
(Continued)

FOREIGN PATENT DOCUMENTS

CN    101156316 A    4/2008
JP    6-120048    4/1994
(Continued)

OTHER PUBLICATIONS

Chinese Office Action dated Feb. 24, 2014 with an English translation.
(Continued)

*Primary Examiner* — Hoa C Nguyen
(74) *Attorney, Agent, or Firm* — McGinn IP Law Group, PLLC

(57) ABSTRACT

A circuit device includes a semiconductor substrate, a first inductor provided over the semiconductor substrate, and a second inductor provided over the semiconductor substrate and coupled to the first inductor. The first inductor and second inductor are wound in a same direction with each other from respective inner end portions to respective outer end portions thereof.

3 Claims, 24 Drawing Sheets

(52) U.S. Cl.
CPC . *H01F2038/143* (2013.01); *H01L 2224/4813* (2013.01); *H01L 2224/48137* (2013.01); *H01L 2924/00014* (2013.01); *H01L 2924/30107* (2013.01)

(56) References Cited

U.S. PATENT DOCUMENTS

| | | |
|---|---|---|
| 6,380,608 B1 | 4/2002 | Bentley |
| 6,486,765 B1 | 11/2002 | Katayanagi |
| 7,877,063 B2 | 1/2011 | Kim et al. |
| 8,288,894 B2 | 10/2012 | Yoshimura |
| 2004/0004525 A1 | 1/2004 | Rittner et al. |
| 2004/0075521 A1 | 4/2004 | Yu et al. |
| 2006/0139114 A1 | 6/2006 | Muramatsu et al. |
| 2007/0205855 A1* | 9/2007 | Hashimoto ............ H01F 5/003 336/200 |
| 2007/0216377 A1 | 9/2007 | Yoshimura |
| 2008/0266042 A1 | 10/2008 | Yoshimura et al. |
| 2009/0046489 A1 | 2/2009 | Yoshimura et al. |
| 2009/0243110 A1 | 10/2009 | Muramatsu et al. |

FOREIGN PATENT DOCUMENTS

| | | |
|---|---|---|
| JP | 2002-262545 A | 9/2002 |
| JP | 2005-327931 A | 11/2005 |
| JP | 2007-250891 A | 9/2007 |

OTHER PUBLICATIONS

Japanese Office Action dated Jun. 4, 2013 with a partial English translation.
Notice of Allowance dated May 5, 2014 in co-pending U.S. Appl. No. 13/306,302.
Office Action dated Jan. 15, 2014 in co-pending U.S. Appl. No. 13/306,302.
Japanese Office Action dated Jan. 26, 2016, with an English translation.
Japanese Office Action dated Jun. 7, 2016, with an English translation.

* cited by examiner

CIRCUIT DEVICE

This application is a Divisional Application of U.S. patent application Ser. No. 13/306,302, which, in turn is a Continuation Application of U.S. patent application Ser. No. 12/457,295, filed on Jun. 5, 2009, now U.S. Pat. No. 8,085,549, issued on Dec. 27, 2011.

This application is based on Japanese patent application No. 2008-174111, the content of which is incorporated hereinto by reference.

BACKGROUND

Technical Field

The present invention relates to a circuit device, capable of transmitting an electrical signal between two circuits unconnected to each other, and having high noise resistance.

Related Art

To transmit an electrical signal between two circuits that are different in potential of the electrical signal to be input, a photo coupler is generally employed. The photo coupler includes a light emitter such as a light emitting diode and a photodetector such as a photo transistor, and serves to convert the electrical signal that has been input into light with the light emitter, and restore the electrical signal from the light with the photodetector, to thereby transmit the electrical signal.

The photo coupler is, however, difficult to be made smaller because of including the light emitter and the photodetector. Besides, in the case where the electrical signal has a high frequency, the photo coupler is unable to follow up the electrical signal. To overcome such problems, a technique of inductively coupling two inductors thereby transmitting the electrical signal has lately been developed.

Meanwhile, Japanese Published patent application A-H06-120048 discloses a thin-film transformer unit. In the thin-film transformer unit, four thin-film transformers having a primary and a secondary coil are disposed on a surface of one silicon substrate. The adjacent transformers share an outermost peripheral coil. In the four thin-film transformers, the primary coils are mutually connected in parallel, and the secondary coils are also mutually connected in parallel.

In the process of transmitting the electrical signal by inductively coupling two inductors, a noise signal may be generated when an external magnetic field is applied to the inductor of the receiving party. It is, therefore, necessary to suppress the generation of such noise signal because of the external magnetic field.

SUMMARY

In one embodiment, there is provided a circuit device including a first transmitting inductor constituted essentially of a first helical conductive pattern, and which receives an input of a transmitted signal;

a first insulating layer provided over or under the first transmitting inductor;

a first receiving inductor, located in a region overlapping with the first transmitting inductor through the first insulating layer and constituted essentially of a second helical conductive pattern, and which generates a received signal corresponding to the transmitted signal; and a second receiving inductor, connected in series to the first receiving inductor and constituted essentially of a third helical conductive pattern, and which generates a voltage in an opposite direction to that generated by the first receiving inductor, in response to a magnetic field of the same direction.

In the circuit device thus constructed, when an external magnetic field is applied to the circuit device, the first receiving inductor and the second receiving inductor generate a voltage in opposite directions. Also, the first receiving inductor and the second receiving inductor are connected in series. Accordingly, the output voltage of the first receiving inductor and the second receiving inductor generated in response to the external magnetic field is lowered. Such arrangement suppresses generation of a noise signal because of the external magnetic field.

Thus, the present invention enables suppressing generation of a noise signal because of the external magnetic field.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
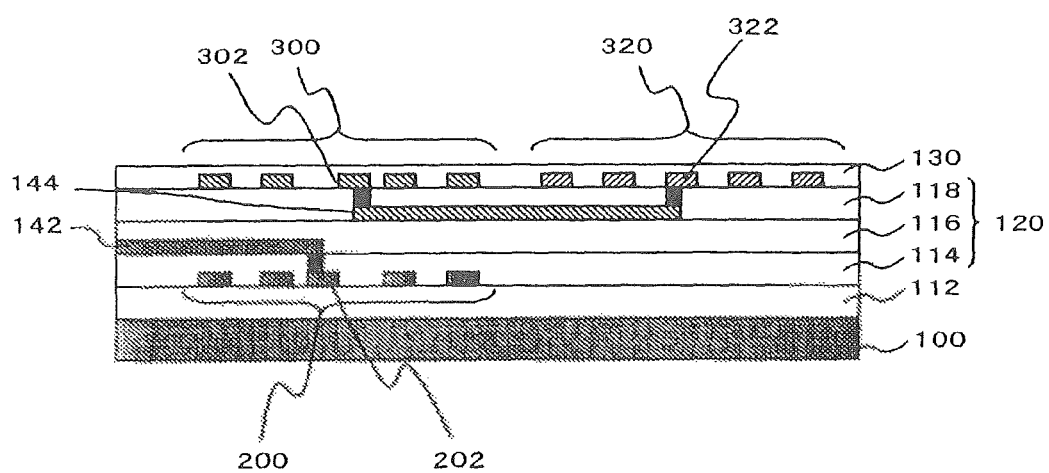
FIG. 1 is a cross-sectional view showing a circuit device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, embodiments of the present invention will be described referring to the drawings. In all the drawings, same constituents are given the same numeral, and the description thereof will not be repeated.

FIG. 1 is a cross-sectional view showing a circuit device according to a first embodiment. The circuit device includes a first transmitting inductor 200, a first insulating layer 120, a first receiving inductor 300, and a second receiving inductor 320. The first transmitting inductor 200 is constituted of a helical conductive pattern, and receives an input of a transmitted signal. The first insulating layer 120 is provided over or under the first transmitting inductor 200. In the example shown in FIG. 1, the first insulating layer 120 is located over the first transmitting inductor 200. The first receiving inductor 300 is located in a region overlapping with the first transmitting inductor 200 through the first insulating layer 120. The first receiving inductor 300 is constituted of a helical conductive pattern, and generates a received signal corresponding to the transmitted signal input to the first transmitting inductor 200. The second receiving inductor 320 is connected in series to the first receiving inductor 300, and constituted of a helical conductive pattern. The second receiving inductor 320 generates a voltage in an opposite direction to the voltage generated by the first receiving inductor 300, in response to a magnetic field of the same direction. In the example shown in FIG. 1, the second receiving inductor 320 is located adjacent to the first receiving inductor 300. Accordingly, no inductor is present in a plan view between the first receiving inductor 300 and the second receiving inductor 320.

In the example shown in FIG. 1, the circuit device includes a substrate 100. The substrate 100 is a semiconductor substrate such as a silicon substrate. Over the substrate 100, insulating layers 112, 114, 116, 118 are stacked in this order. The insulating layer 114, 116, 118 constitute the first insulating layer 120.

On the respective surface of the insulating layers 112, 114, 116, 118, a conductive pattern such as an interconnect is provided. The conductive patterns may be, for example, an Al alloy pattern formed on the insulating layer, or a Cu alloy pattern embedded in the insulating layer through a Damascene process. The first transmitting inductor 200 is located on the surface of the insulating layer 112, and the first receiving inductor 300 and the second receiving inductor 320 are located on the surface of the insulating layer 118, in other words on an uppermost interconnect layer. The first receiving inductor 300, the second receiving inductor 320, and the insulating layer 118 are covered with a cover layer 130.

The inner end portion 202 of the first transmitting inductor 200 is led out of the first transmitting inductor 200 in a plan view, through a via plug provided in the insulating layer 114 and a first escape routing 142 provided on the surface of the insulating layer 114. The inner end portion 302 of the first receiving inductor 300 is led out of the second transmitting inductor 300 through a via plug provided in the insulating layer 118 and a second escape routing 144 provided on the surface of the insulating layer 114. In this embodiment, the end portion 302 is connected to the inner end portion 322 of the second receiving inductor 320 through the via plug and the second escape routing 144. The second escape routing 144 is located in the layer closer to the first receiving inductor 300 than the first escape routing 142 is.

In a plan view, the inner end portion 302 of the first receiving inductor 300 does not overlap with the inner end portion 202 of the first transmitting inductor 200. Accordingly, the second escape routing 144 and the first escape routing 142 do no overlap in a plan view. Such configuration makes a minimal spacing between the second escape routing 144 and the first escape routing 142 larger than in the case where the end portions 302 and 202 overlap. Here, it is preferable that the center of the helical shape of the first receiving inductor 300 and that of the first transmitting inductor 200 overlap with each other.

Figure 2:
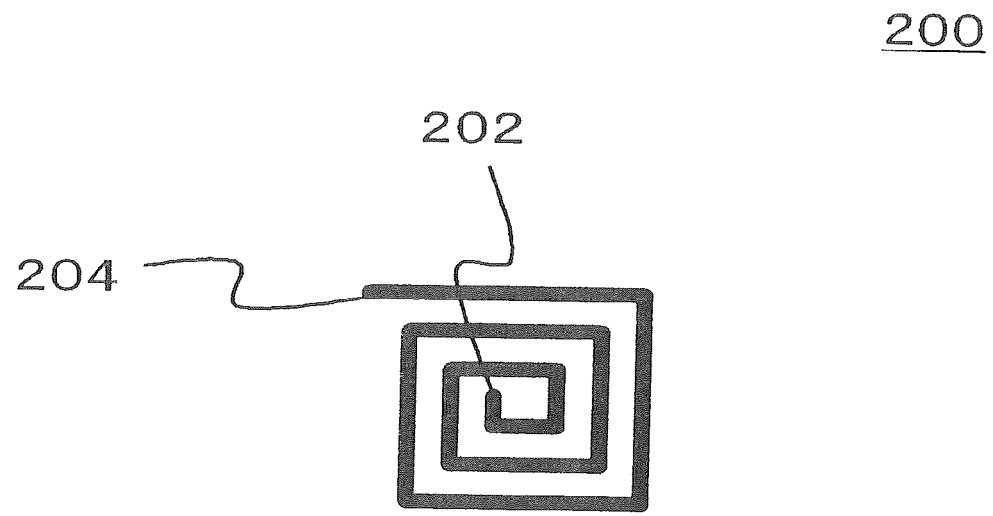
FIG. 2 is a plan view showing a shape of a first transmitting inductor.

FIG. 2 is a plan view showing a shape of the first transmitting inductor 200. In FIG. 2, the first transmitting inductor 200 is of a helical shape wound clockwise from an outer end portion 204 toward an inner end portion 202. Instead, the first transmitting inductor 200 may be formed in a counterclockwise helical shape from the outer end portion 204 toward the inner end portion 202.

Figure 3A:
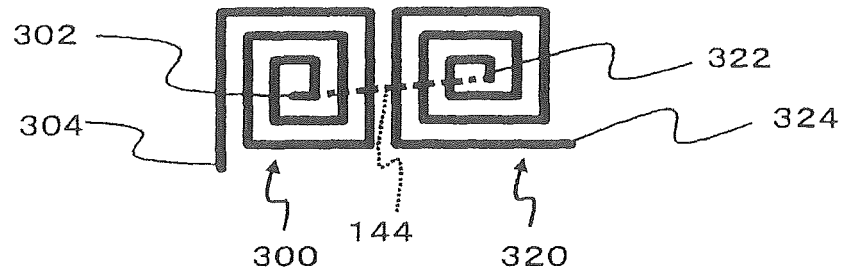
FIGS. 3A to 3C are plan views each showing a shape of a first receiving inductor and a second receiving inductor.
Figure 3B:
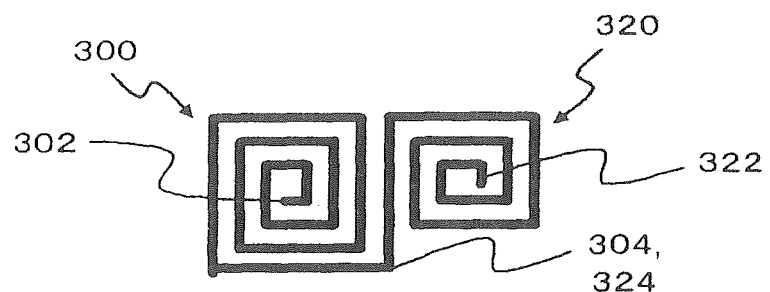
Figure 3C:
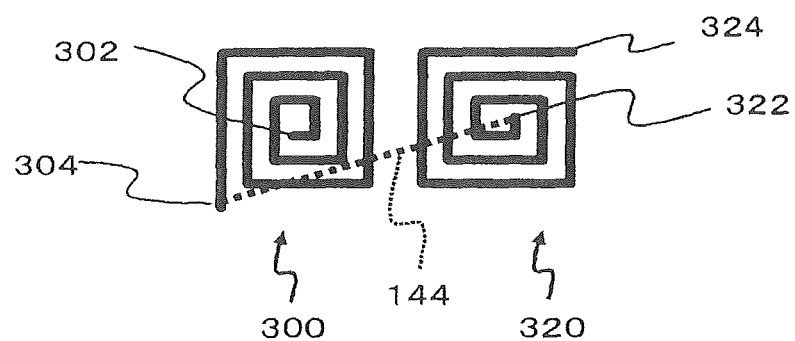

FIGS. 3A to 3C are plan views each showing a shape of the first receiving inductor 300 and the second receiving inductor first receiving inductor 320. In all these drawings, the first receiving inductor 300 and the second receiving inductor 320 are formed in the same number of turns and in the same interconnect pitch, so as to generate a voltage of an equal absolute value in response to a magnetic field of an equal absolute value.

The example of FIG. 3A corresponds to FIG. 1. In this example, the first receiving inductor 300 and the second receiving inductor 320 are wound in the same direction. More specifically, the first receiving inductor 300 and the second receiving inductor 320 are wound clockwise from the outer end portion 304, 324 toward the inner end portion 302, 322, respectively. Here, the winding direction may be opposite. The inner end portions 302, 322 are connected to each other through the second escape routing 144.

The example of FIG. 3B represents a different pattern from FIG. 1. In this example, the first receiving inductor 300 and the second receiving inductor 320 are of the same pattern and wound in the same direction as in FIG. 3A. The outer end portions 304, 324 are connected to each other.

The example of FIG. 3C represents a different pattern from FIG. 1. In this example, the first receiving inductor 300 and the second receiving inductor 320 are wound in opposite directions, and the outer end portion 304 of the first receiving inductor 300 and the inner end portion 322 of the second receiving inductor 320 are connected to each other through the second escape routing 144. Instead, the inner end portion 302 of the first receiving inductor 300 and the outer end portion 324 of the second receiving inductor 320 may be connected through the second escape routing 144.

An example of the forming process of the circuit device shown in FIGS. 1 to 3C will be described hereunder. First, the insulating layer 112 is formed over the substrate 100. On the substrate 100, a transistor (not shown) may be provided. Then the first transmitting inductor 200 is formed on the surface of the insulating layer 112. In the case where the first transmitting inductor 200 is formed as a conductive pattern on the insulating layer 112, the first transmitting inductor 200 may be formed through forming a conductive layer on the insulating layer 112 and then selectively removing the conductive layer. In the case where the first transmitting inductor 200 is embedded in the insulating layer 112, the first transmitting inductor 200 may be formed through forming a trench pattern on the insulating layer 112, forming a conductive layer in the trench and on the insulating layer 112, and removing the conductive layer on the insulating layer 112.

Thereafter, the insulating layer 114 is formed over the insulating layer 112 and the first transmitting inductor 200. A via plug is then formed in the insulating layer 114, for connection with the inner end portion 202 of the first transmitting inductor 200. On the surface of the insulating layer 114, the first escape routing 142 is formed. The first escape routing 142 may be formed through either process employed for forming the first transmitting inductor 200.

Over the insulating layer 114 and the first escape routing 142, the insulating layer 116 is formed. The second escape routing 144 is then formed on the surface of the insulating layer 116. The second escape routing 144 may be formed through either process employed for forming the first transmitting inductor 200.

Then the insulating layer 118 is formed over the insulating layer 116 and the second escape routing 144. In the insulating layer 118, two via plugs are formed. These via plugs serve to connect the inner end portions 302, 322 of the first receiving inductor 300 and the second receiving inductor 320 to the second escape routing 144. Then on the surface of the insulating layer 118, the first receiving inductor 300 and the second receiving inductor 320 are formed. These inductors may be formed through either process employed for forming the first transmitting inductor 200. Finally, the cover layer 130 is formed over the insulating layer 118, the first receiving inductor 300, and the second receiving inductor 320.

This embodiment offers the following advantageous effects. When the transmitted signal is input from a transmitting circuit (not shown) to the first transmitting inductor 200, the first transmitting inductor 200 generates a magnetic field. The first receiving inductor 300 generates a voltage in response to the magnetic field generated by the first transmitting inductor 200. In contrast, the second receiving inductor 320 barely generates a voltage in response to the magnetic field generated by the first transmitting inductor 200. Accordingly, a receiving circuit (not shown) can detect the received signal corresponding to the transmitted signal by detecting the voltage generated by the first receiving inductor 300 and the second receiving inductor 320 (for example, the voltage between the end portions 304 and 324 in FIG. 3A).

In the case where an external magnetic field is applied to the circuit device shown in FIG. 1, the external magnetic field is applied to the first receiving inductor 300 and the second receiving inductor 320 in generally the same direction. As stated earlier, the second receiving inductor 320 generates the voltage in a substantially opposite direction to the voltage generated by the first receiving inductor 300, in response to the magnetic field of the same direction. Since the first receiving inductor 300 and the second receiving inductor 320 are connected in series, the voltage generated in response to the external magnetic field (for example, the voltage between the end portions 304 and 324 in FIG. 3A) is lowered. Such arrangement suppresses the generation of a noise signal because of the external magnetic field. This advantage can be especially prominently exhibited by forming the first receiving inductor 300 and the second receiving inductor 320 in generally the same number of turns.

Also, in a plan view, the inner end portion 302 of the first receiving inductor 300 does not overlap with the inner end portion 202 of the first transmitting inductor 200. Such configuration allows preventing the first escape routing 142 and the second escape routing 144 from overlapping in a plan view. Accordingly, a minimum spacing between the second escape routing 144 and the first escape routing 142 becomes larger than in the case where the end portions 302 and 202 are located so as to overlap, which leads to improved withstand voltage between the first transmitting inductor 200 and the first receiving inductor 300. Such configuration suppresses, therefore, emergence of dielectric breakdown between the transmitting party and the receiving party, even though the reference potential of the transmitted signal and that of the received signal are largely different.

Figure 4:
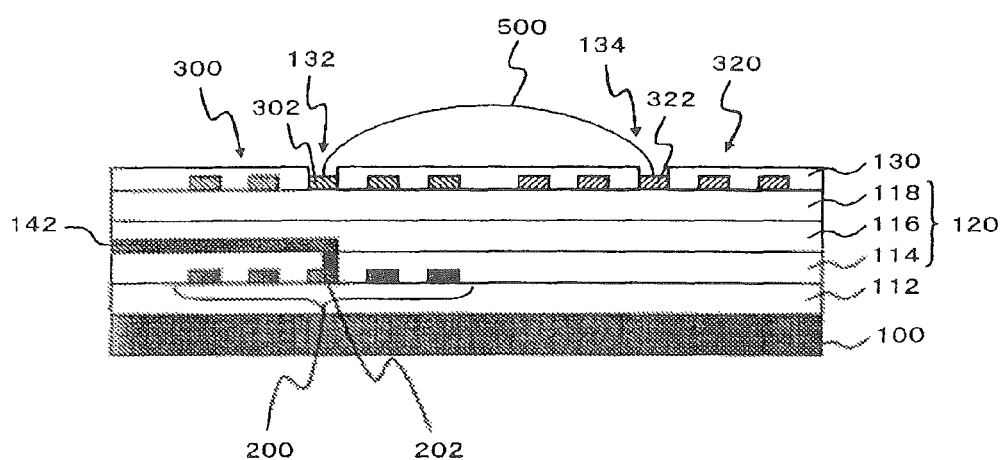
FIG. 4 is a cross-sectional view showing a circuit device according to a second embodiment.

FIG. 4 is a cross-sectional view showing a circuit device according to a second embodiment. This circuit device has the same structure as that of the first embodiment, except for the following features.

The cover layer 130 includes an opening in which the inner end portion 302 of the first receiving inductor 300 is exposed, and an opening in which the inner end portion 322 of the second receiving inductor 320 is exposed. The end portions 302 and 322 exposed in the openings are connected to each other by means of a wire 500. In other words, the end portion 302 is led out of the first receiving inductor 300 through the wire 500. Another difference is that the second escape routing 144 and the via plugs connected thereto according to the first embodiment are not provided.

This embodiment also provides the same advantageous effects as those offered by the first embodiment. Also, employing the wire 500 instead of the second escape routing 144 enables increasing the minimum spacing between the first transmitting inductor 200 and the interconnect connected thereto, and the first receiving inductor 300 and the interconnect connected thereto, compared with the case of employing the second escape routing 144. Such configuration suppresses, therefore, emergence of dielectric breakdown between the first transmitting inductor 200 and the interconnect connected thereto, and the first receiving inductor 300 and the interconnect connected thereto, even though the reference potential of the transmitted signal and that of the received signal are largely different.

Figure 5A:
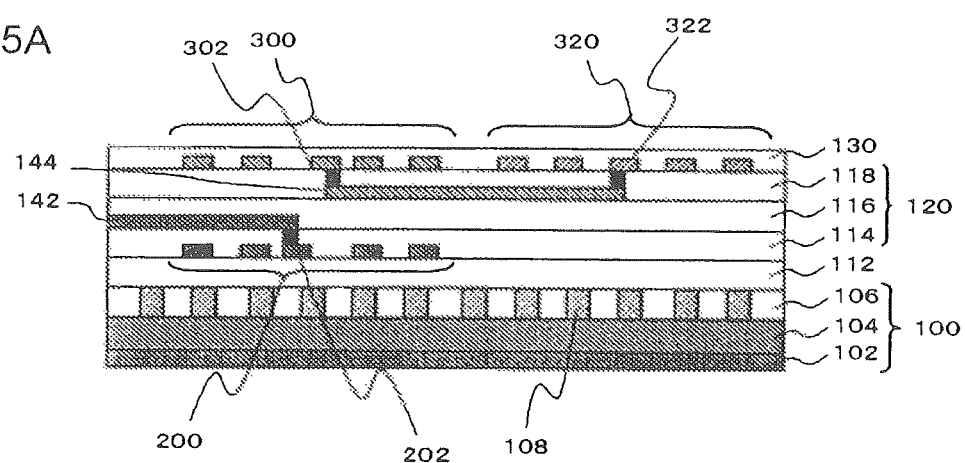
FIG. 5A is a cross-sectional view showing a circuit device according to a third embodiment.

FIG. 5A is a cross-sectional view showing a circuit device according to a third embodiment. This circuit device has the same structure as that of the first embodiment, except that a silicon-on-insulator (hereinafter, SOI) substrate is employed as the substrate 100. In this embodiment, the substrate 100 includes a silicon substrate 102, over which an insulating layer 104 and a silicon layer 106 are stacked in this order. The silicon layer 106 includes a plurality of embedded insulating layers 108. The first transmitting inductor 200, the first receiving inductor 300, and the second receiving inductor 320 are located above the embedded insulating layers 108. The silicon layer 106 may also include a transistor (not shown) and an isolation layer.

In the example shown in FIG. 5, the embedded insulating layers 108 are disposed such that the respective bottom portion is in contact with the insulating layer 104, however the bottom portion may be spaced from the insulating layer 104. In the latter case, the embedded insulating layer 108 may be formed through the same process of forming the isolation layer of the transistor (not shown) in the silicon layer 106.

Figure 5B:
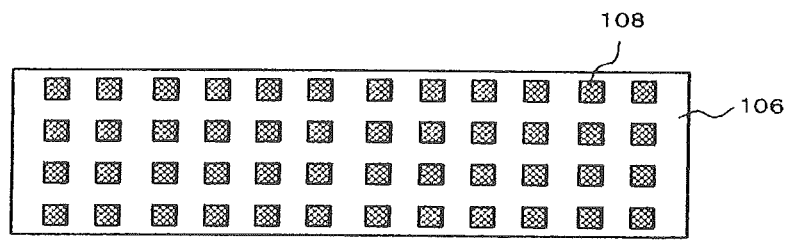
FIG. 5B is a plan view showing a planar layout of an embedded insulating layer.

FIG. 5B is a plan view showing a planar layout of the embedded insulating layer 108. The embedded insulating layers 108 are aligned in a matrix form with a spacing from each other.

This embodiment also provides the same advantageous effects as those offered by the first embodiment. Also, the SOI substrate is employed as the substrate 100, and the silicon layer 106 includes the plurality of embedded insulating layer 108. The embedded insulating layers 108 are located below the first transmitting inductor 200, the first receiving inductor 300, and the second receiving inductor 320. Such configuration suppresses emergence of eddy current on the substrate 100.

Figure 6:
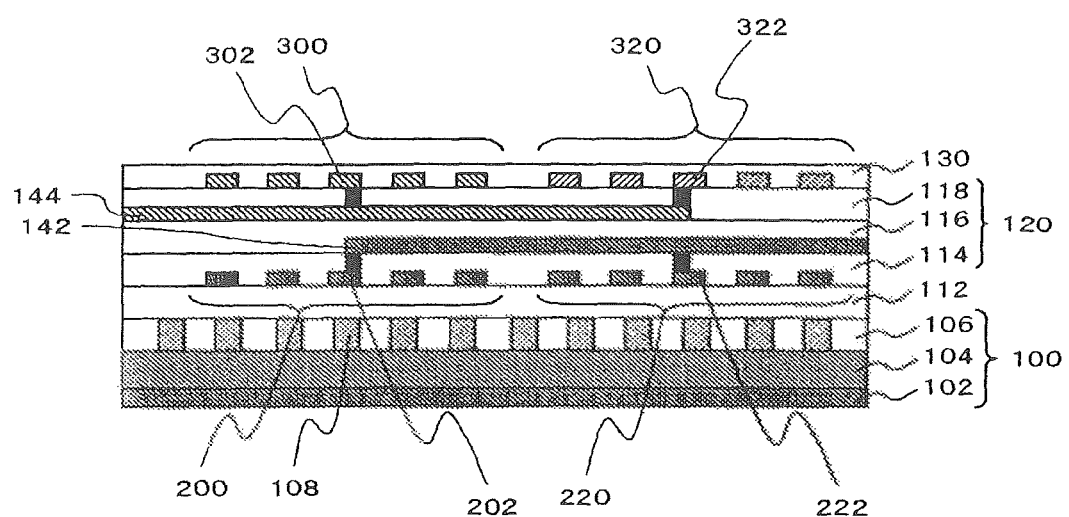
FIG. 6 is a cross-sectional view showing a circuit device according to a fourth embodiment.

FIG. 6 is a cross-sectional view showing a structure of a circuit device according to a fourth embodiment. This circuit device has the same structure as that of the third embodiment, except that a second transmitting inductor 220 is provided, that the first escape routing 142 is connected also to an inner end portion 222 of the second transmitting inductor 220, and that the second escape routing 144 is led out of the first receiving inductor 300 and the second receiving inductor 320. The second transmitting inductor 220 is constituted of a helical conductive pattern.

In the example shown in FIG. 6, the second transmitting inductor 220 is provided in the same layer that includes the first transmitting inductor 200, and located in a region overlapping with the second receiving inductor 320 through the first insulating layer 120. The second transmitting inductor 220 receives the same transmitted signal through the first escape routing 142 as that received by the first transmitting inductor 200, however the direction of the magnetic field generated upon receiving the transmitted signal is opposite to that generated by the first transmitting inductor 200.

The first escape routing 142 is connected to the inner end portion 202 of the first transmitting inductor 200, and to the inner end portion 222 of the second transmitting inductor 220 through the via plug formed in the insulating layer 114. Accordingly, the first transmitting inductor 200 and the second transmitting inductor 220 are connected in parallel to the first escape routing 142. Also, the second transmitting inductor 220 is located adjacent to the first transmitting inductor 200. Therefore, no inductor is present in a plan view between the first transmitting inductor 200 and the second transmitting inductor 220.

Figure 7A:
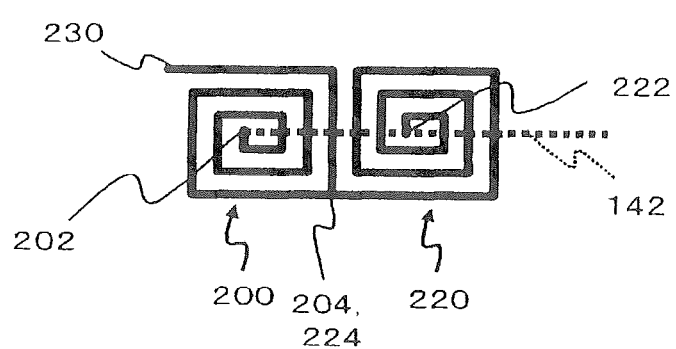
FIGS. 7A and 7B are plan views each showing a shape of the first transmitting inductor and a second transmitting inductor.
Figure 7B:
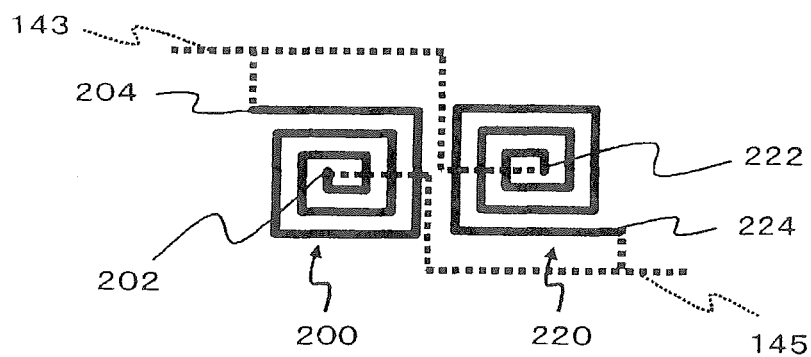

FIGS. 7A and 7B are plan views each showing a shape of the first transmitting inductor 200 and the second transmitting inductor 220. In all these drawings the first transmitting inductor 200 and the second transmitting inductor 220 are formed in generally the same number of turns, however the number of turns may be different from each other.

The example of FIG. 7A corresponds to FIG. 6. In this example, the first transmitting inductor 200 and the second transmitting inductor 220 are wound in the opposite directions. More specifically, the first transmitting inductor 200 is wound clockwise from the outer end portion 204 toward the inner end portion 202, while the second transmitting inductor 220 is wound counterclockwise from an outer end portion 224 toward the inner end portion 222. Here, the combination of the winding directions may be opposite. The inner end portions 202, 222 are connected to each other through the first escape routing 142. The outer end portions 204, 224 are also connected to each other, such that these end portions are led out of the first transmitting inductor 200 and the second transmitting inductor 220 through an interconnect 230. The interconnect 230 is provided, for example, in the same interconnect layer that includes the first transmitting inductor 200 and the second transmitting inductor 220. The first transmitting inductor 200 and the second transmitting inductor 220 are connected in parallel to the first escape routing 142 serving as the input line of the transmitted signal, and to the interconnect 230.

The example of FIG. 7B represents a different pattern from FIG. 6. In this example, the first transmitting inductor 200 and the second transmitting inductor 220 are wound in the same direction. The inner end portion 202 of the first transmitting inductor 200 and the outer end portion 224 of the second transmitting inductor 220 are connected to each other through an escape routing 145. The outer end portion 204 of the first transmitting inductor 200 and the inner end portion 222 of the second transmitting inductor 220 are connected to each other through an escape routing 143. The escape routings 143, 145 may be formed through a similar process to that for the first escape routing 142 shown in FIG. 6. The first transmitting inductor 200 and the second transmitting inductor 220 are connected in parallel to the escape routings 143, 145 serving as the input line of the transmitted signal.

This embodiment also provides the same advantageous effects as those offered by the first embodiment. Also, the second transmitting inductor 220 is located in the region overlapping with the second receiving inductor 320, and the second transmitting inductor 220 receives the same transmitted signal as that received by the first transmitting inductor 200. Since the second transmitting inductor 220 generates a magnetic field in the opposite direction to that generated by the first transmitting inductor 200, the first receiving inductor 300 and the second receiving inductor 320 generate a voltage in the same direction when the first transmitting inductor 200 and the second transmitting inductor 220 receives the transmitted signal. Such configuration increases the voltage of the received signal generated by the first receiving inductor 300 and the second receiving inductor 320 based on the transmitted signal, thereby suppressing emergence of a signal transmission error.

Also, no inductor is present between the first transmitting inductor 200 and the second transmitting inductor 220. Accordingly, when the first transmitting inductor 200 and the second transmitting inductor 220 receive the transmitted signal, the magnetic field generated by the first transmitting inductor 200 and that generated by the second transmitting inductor 220 are coupled, to thereby minimize leakage of the magnetic field. Such arrangement allows further increasing the voltage of the received signal generated by the first receiving inductor 300 and the second receiving inductor 320 based on the transmitted signal, thereby increasing the signal reception sensitivity.

In this embodiment, the second transmitting inductor 220 may be located in the region overlapping with the second receiving inductor 320 through another insulating layer (second insulating layer) than the first insulating layer 120. For example, in the case where the first insulating layer 120 is constituted of a plurality of insulating layers, the second transmitting inductor 220 may be located in the region overlapping with the second receiving inductor 320 through a part of the insulating layers constituting the first insulating layer 120.

Figure 8A:
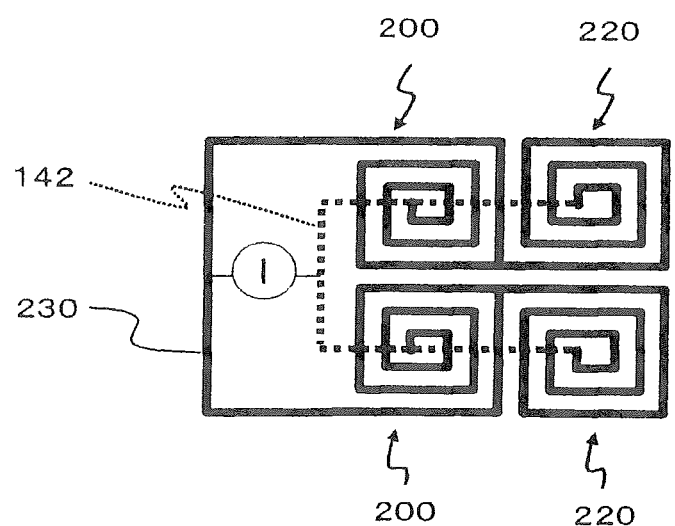
FIGS. 8A and 8B are plan views each showing a shape of an inductor of a circuit device according to a fifth embodiment.
Figure 8B:
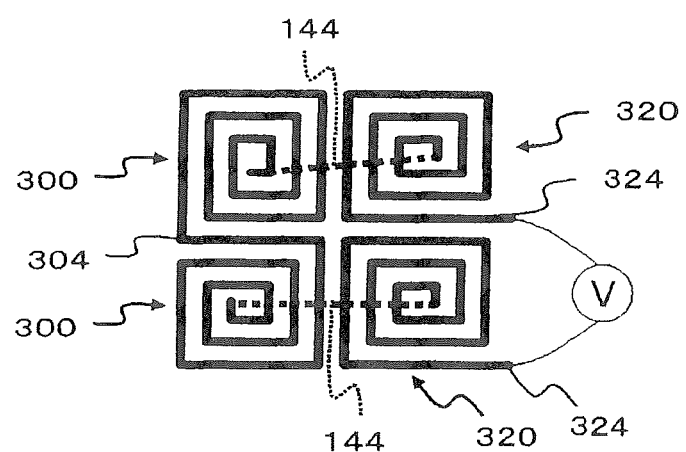

FIGS. 8A and 8B are plan views each showing a shape of an inductor of a circuit device according to a fifth embodiment. In this embodiment the circuit device includes an even number of signal transmitting circuits including the first transmitting inductor 200, the second transmitting inductor 220, the first receiving inductor 300, and the second receiving inductor 320. Each of the signal transmitting circuits is disposed such that the same inductors are located adjacent to each other. Between the signal transmitting circuits, no other inductor is provided.

FIG. 8A is a plan view showing the shape of the first transmitting inductor 200 and the second transmitting inductor 220. All the first transmitting inductors 200 and the second transmitting inductors 220 are connected in parallel to the first escape routing 142 serving as the input line of the transmitted signal, and to the interconnect 230. The first transmitting inductors 200 adjacently disposed generate a magnetic field in the opposite directions upon receipt of the transmitted signal. The second transmitting inductors 220 adjacently disposed also generate a magnetic field in the opposite directions upon receipt of the transmitted signal.

FIG. 8B is a plan view showing the shape of the first receiving inductor 300 and the second receiving inductor 320. All the first receiving inductors 300 and the second receiving inductors 320 are connected in series, in such a direction that, upon receipt of the transmitted signal, the voltage generated in each inductor is summed. In the example shown in FIG. 8B, all the first receiving inductors 300 and the second receiving inductors 320 are wound in the same direction. The first receiving inductors 300 adjacently disposed are connected by the outer end portion 304. The receiving circuit detects the received signal by detecting the voltage between the outer end portions 324 of the second receiving inductors 320 adjacently disposed.

This embodiment also provides the same advantageous effects as those offered by the fourth embodiment. Also, the first transmitting inductors 200 adjacently disposed generate the magnetic field in the opposite directions upon receipt of the transmitted signal, and the second transmitting inductors 220 adjacently disposed also generate the magnetic field in the opposite directions. Accordingly, the magnetic fields generated by the adjacently disposed first transmitting inductors 200 are coupled with each other, and those generated by the adjacently disposed second transmitting inductors 220 are also coupled with each other. Such arrangement further minimizes the leakage of the magnetic field, thereby facilitating the first receiving inductor 300 and the second receiving inductor 320 to receive the signal.

Figure 9:
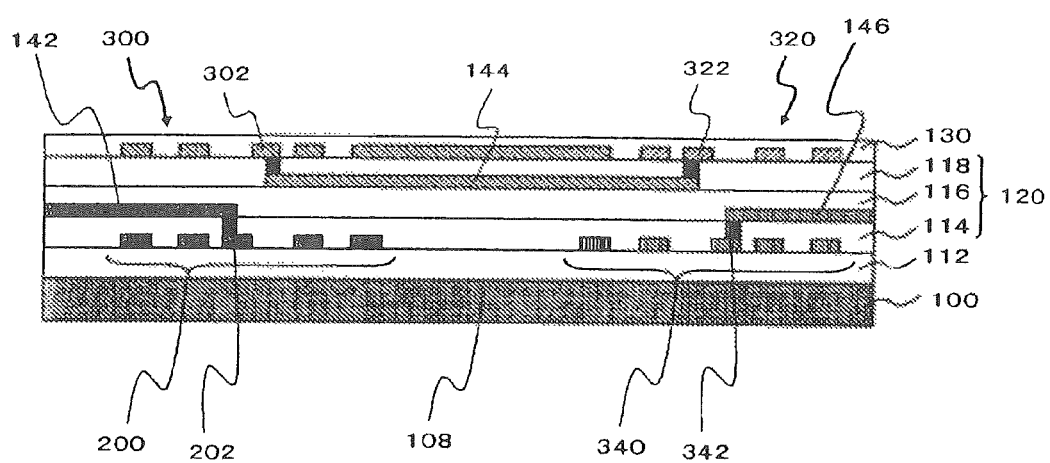
FIG. 9 is a cross-sectional view showing a circuit device according to a sixth embodiment.

FIG. 9 is a cross-sectional view showing a circuit device according to a sixth embodiment. This circuit device has the same structure as that of the first embodiment, except that a third receiving inductor 340 and an escape routing 146 are provided. In this embodiment the received signal is output by the third receiving inductor 340.

In the example shown in FIG. 9, the third receiving inductor 340 is located in a region overlapping with the second receiving inductor 320 through the first insulating layer 120. The escape routing 146 is connected to an inner end portion 342 of the third receiving inductor 340 through the via plug provided in the insulating layer 114, to thereby lead out the end portion 342 from the third receiving inductor 340.

Figure 10A:
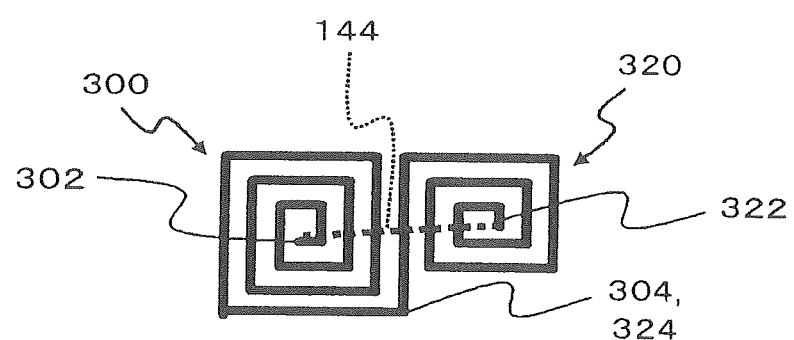
FIG. 10A is a plan view showing the first receiving inductor and the second receiving inductor of the circuit device shown in FIG. 9.

FIG. 10A is a plan view showing the first receiving inductor 300 and the second receiving inductor 320 of the circuit device shown in FIG. 9. The first receiving inductor 300 and the second receiving inductor 320 are wound in the same direction. The outer end portions 304, 324 are connected to each other, and the inner end portions 302, 322 are connected to each other through the second escape routing 144.

Figure 10B:
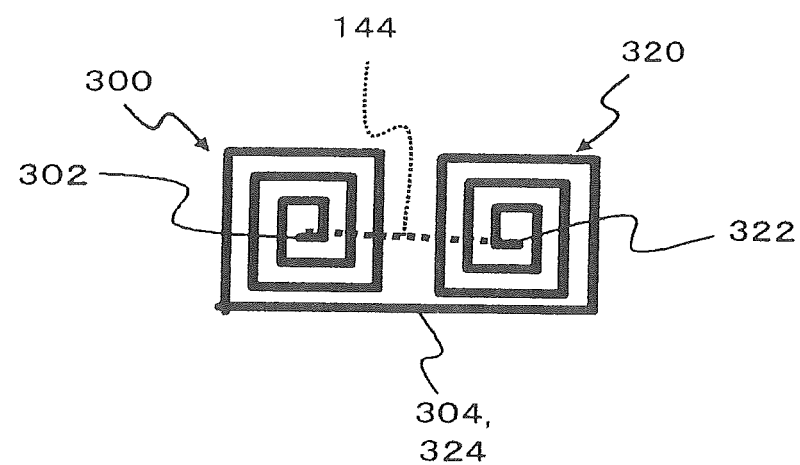
FIG. 10B is a plan view showing a variation of FIG. 10A.

FIG. 10B depicts a variation of FIG. 10A. FIG. 10B is the same as FIG. 10A except that the first receiving inductor 300 and the second receiving inductor 320 are wound in the opposite directions. In FIG. 10B, further, the end portions 302, 324 may be connected to each other and the end portions 322, 304 may be connected to each other.

The foregoing embodiment offers the following advantageous effects. Once the first transmitting inductor 200 receives the transmitted signal, the first receiving inductor 300 generates a voltage as in the first embodiment. This voltage produces a current that flows through the second receiving inductor 320, so that the second receiving inductor 320 generates a magnetic field. Once the second receiving inductor 320 generates the magnetic field, the third receiving inductor 340 generates a voltage in response to the magnetic field. The receiving circuit detects such voltage as the received signal. Thus, the signal can be transmitted from the first transmitting inductor 200 to the third receiving inductor 340, through the first receiving inductor 300 and the second receiving inductor 320. Also, in the case where an external magnetic field is applied, the first receiving inductor 300 and the second receiving inductor 320 generate the voltage in mutually cancelling directions. Such arrangement enables suppressing the generation of a noise signal because of the external magnetic field.

Also, the signal has to pass through the first insulating layer 120 twice, before being transmitted from the first transmitting inductor 200 to the third receiving inductor 340. Accordingly, the withstand voltage between the first transmitting inductor 200 and the third receiving inductor 340 can be improved. Such configuration suppresses, therefore, emergence of dielectric breakdown between the transmitting party and the receiving party, even though the reference potential of the transmitted signal and that of the received signal are largely different.

In this embodiment, the third receiving inductor 340 may be located in the region overlapping with the second receiving inductor 320 through another insulating layer (third insulating layer) than the first insulating layer 120. For example, in the case where the first insulating layer 120 is constituted of a plurality of insulating layers, the third transmitting inductor 340 may be located in the region overlapping with the second receiving inductor 320 through a part of the insulating layers constituting the first insulating layer 120.

Figure 11A:
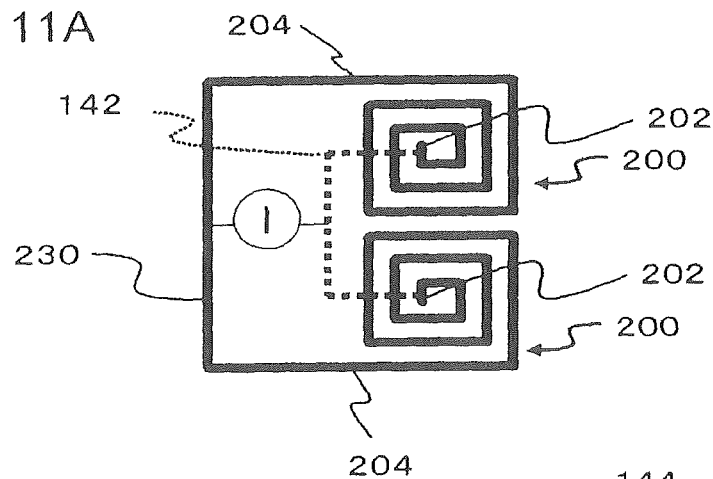
FIGS. 11A to 11C are plan views each showing a shape of an inductor of a circuit device according to a seventh embodiment.
Figure 11B:
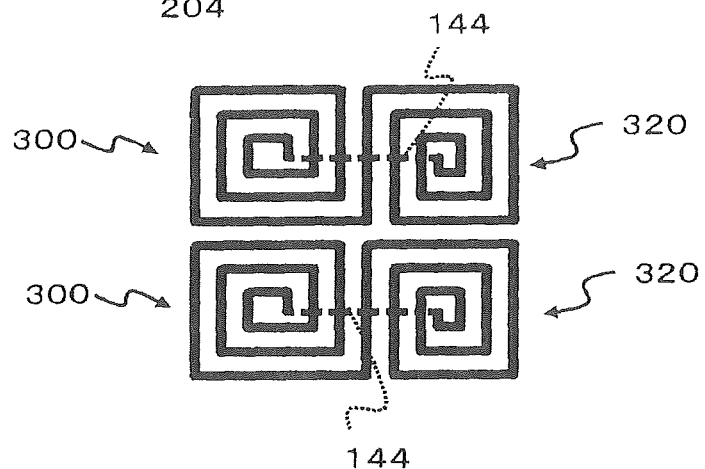
Figure 11C:
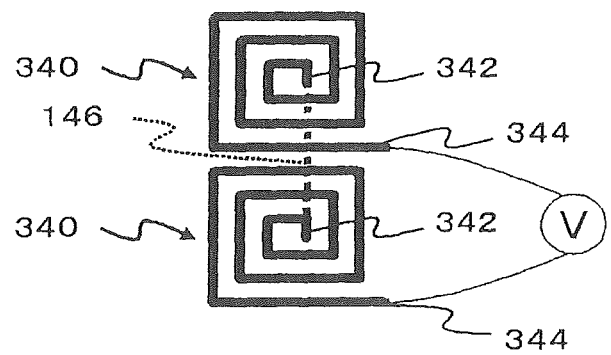

FIGS. 11A to 11C are plan views each showing a shape of an inductor of a circuit device according to a seventh embodiment. This circuit device has the same structure as that of the sixth embodiment except for including an even number of signal transmitting circuits including the first transmitting inductor 200, the first receiving inductor 300, the second receiving inductor 320, and the third receiving inductor 340. The even number of signal transmitting circuits is disposed such that the same inductors are located adjacent to each other. Between the signal transmitting circuits, no other inductor is provided.

FIG. 11A is a plan view showing the shape of the first transmitting inductor 200. All the first transmitting inductors 200 are connected in parallel to the first escape routing 142 serving as the input line of the transmitted signal and to the interconnect 230. The first transmitting inductors 200 adjacently disposed generate, upon receipt of the transmitted signal, magnetic fields in the opposite directions.

FIG. 11B is a plan view showing the shape of the first receiving inductor 300 and the second receiving inductor 320. In the example shown therein, the first receiving inductors 300 adjacently disposed are wound in the same direction, and the second receiving inductors 320 adjacently disposed are also wound in the same direction. However, the combination of the winding directions may be opposite.

FIG. 11C is a plan view showing the shape of the third receiving inductor 340. The third receiving inductors 340 adjacently disposed are connected in series so that the voltages are generated in the opposite directions in response to the same magnetic field, and that the voltages generated by the first transmitting inductors 200 upon receipt of the transmitted signal are summed. In the example shown in FIG. 11C, the third receiving inductors 340 are wound in the same direction, and the inner end portions 342 are connected to each other. The receiving circuit detects the received signal by detecting the voltage between the outer end portions 344 of the adjacently disposed third receiving inductors 340. Here, the outer end portions 344 may be connected to each other instead of the inner end portions 342. In this case, the receiving circuit detects the received signal by detecting the voltage between the inner end portions 342 of the adjacently disposed third receiving inductors 340.

This embodiment also provides the same advantageous effects as those offered by the sixth embodiment. Also, the first transmitting inductors 200 adjacently disposed generate, upon receipt of the transmitted signal, the voltage in the opposite directions. Accordingly, the magnetic fields generated by the first transmitting inductors 200 adjacently disposed are coupled, to thereby minimize leakage of the magnetic field. Such configuration facilitates the first receiving inductor 300 to receive the signal.

Also, the first receiving inductors 300 adjacently disposed are wound in the same direction. As already stated, the first transmitting inductors 200 adjacently disposed generate the magnetic field in the opposite directions. Accordingly, when the first transmitting inductor 200 receives the transmitted signal, the first receiving inductors 300 adjacently disposed generate the voltage in the opposite directions. Since the second receiving inductors 320 are wound in the same direction, the second receiving inductors 320 adjacently disposed generate the magnetic field in the opposite directions. Accordingly, the magnetic fields generated by the second receiving inductors 320 adjacently disposed are coupled, to thereby minimize leakage of the magnetic field. Such configuration facilitates the third receiving inductor 340 to receive the signal.

Further, the third receiving inductors 340 generate the voltage in the opposite directions in response to the same magnetic field. Accordingly, the voltage generated by the third receiving inductors 340 in response to the external magnetic field is lowered. Such arrangement suppresses the generation of a noise signal because of the external magnetic field. This advantage can be especially prominently exhibited by forming the third receiving inductors 340 adjacently disposed in the same number of turns.

Figure 12:
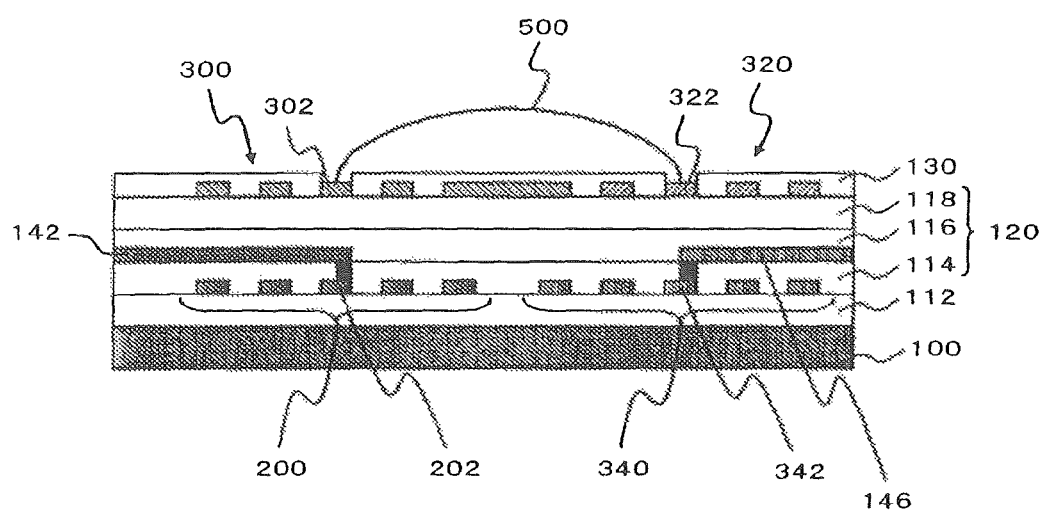
FIG. 12 is a cross-sectional view showing a circuit device according to an eighth embodiment.

FIG. 12 is a cross-sectional view showing a circuit device according to an eighth embodiment. This circuit device has the same structure as that of the sixth or the seventh embodiment, except for the following features.

The cover layer 130 includes an opening in which the inner end portion 302 of the first receiving inductor 300 is exposed, and an opening in which the inner end portion 322 of the second receiving inductor 320 is exposed. The end portions 302 and 322 exposed in the openings are connected to each other by means of a wire 500. In other words, the end portion 302 is led out of the first receiving inductor 300 through the wire 500. Another difference is that the second escape routing 144 and the via plugs connected thereto shown in FIG. 9 are not provided.

This embodiment also provides the same advantageous effects as those offered by the sixth or the seventh embodiment. Also, employing the wire 500 instead of the second escape routing 144 enables increasing the minimum spacing between the first transmitting inductor 200 and the interconnect connected thereto, and the first receiving inductor 300 and the interconnect connected thereto, compared with the case of employing the second escape routing 144. Such configuration suppresses, therefore, emergence of dielectric breakdown between the first transmitting inductor 200 and the interconnect connected thereto, and the first receiving inductor 300 and the interconnect connected thereto, even though the reference potential of the transmitted signal and that of the received signal are largely different.

Figure 13:
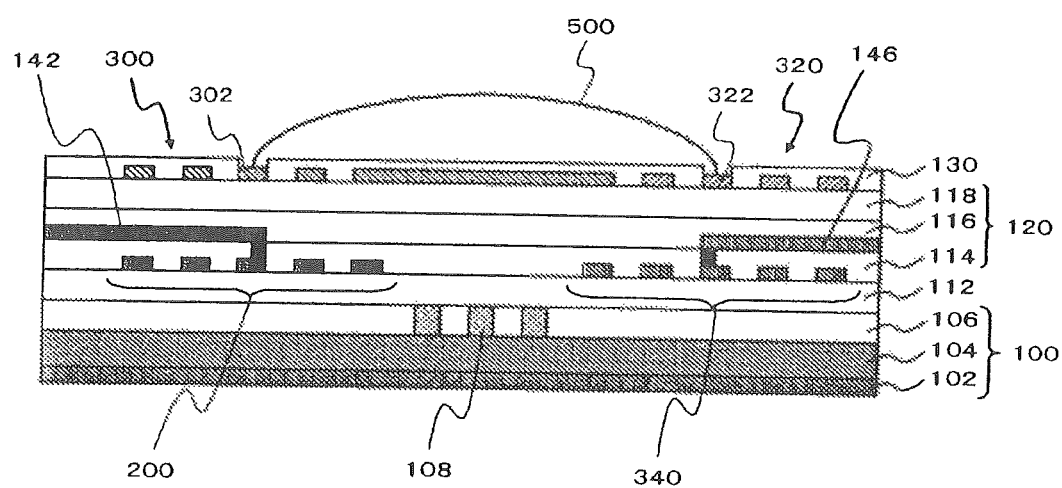
FIG. 13 is a cross-sectional view showing a circuit device according to a ninth embodiment.

FIG. 13 is a cross-sectional view showing a circuit device according to a ninth embodiment. This circuit device has the same structure as that of the eighth embodiment, except that a SOI substrate is employed as the substrate 100, and that the silicon layer 106 of the SOI substrate includes an embedded insulating layer 108. The structure of the substrate 100, constituted of the SOI substrate, is the same as that of the third embodiment. In this embodiment, however, the embedded insulating layer 108 is provided below a region between the first receiving inductor 300 and the second receiving inductor 320, but not below the first receiving inductor 300 and below the second receiving inductor 320.

Figure 14:
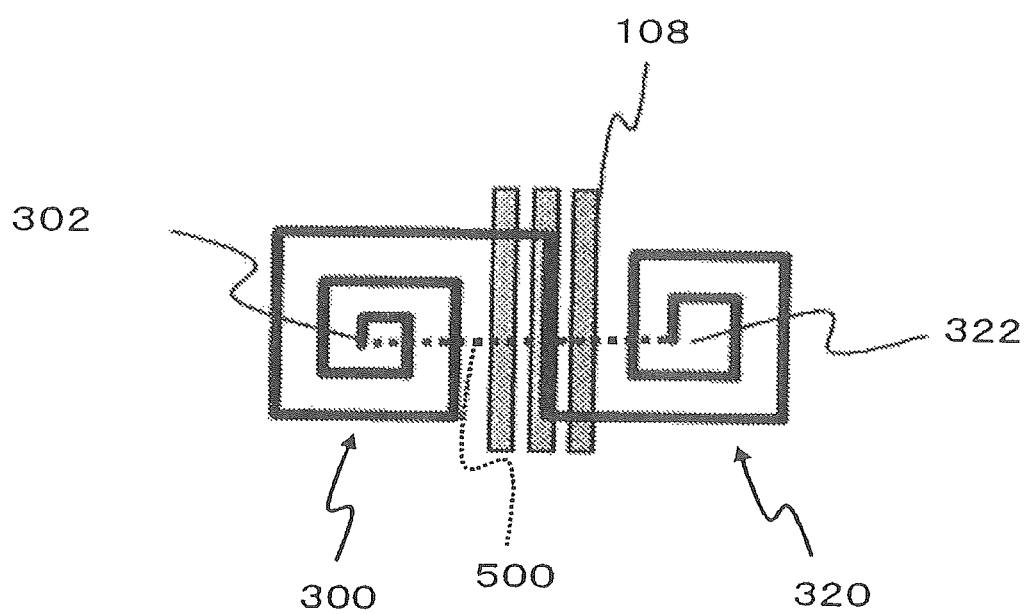
FIG. 14 is a plan view showing a positional relationship and a planar shape of embedded insulating layers of the circuit device shown in FIG. 13.

FIG. 14 is a plan view showing a positional relationship and a planar shape of the embedded insulating layers 108 of the circuit device shown in FIG. 13. The embedded insulating layer 108 is provided so as to insulate the silicon layer 106 between the region including the first receiving inductor 300 and the region including the second receiving inductor 320.

This embodiment also provides the same advantageous effects as those offered by the eighth embodiment. Also, the region of the silicon layer 106 including the first receiving inductor 300 and the region thereof including the second receiving inductor 320 are insulated by the embedded insulating layer 108. Such structure enables providing different substrate potentials to those regions.

Figure 15:
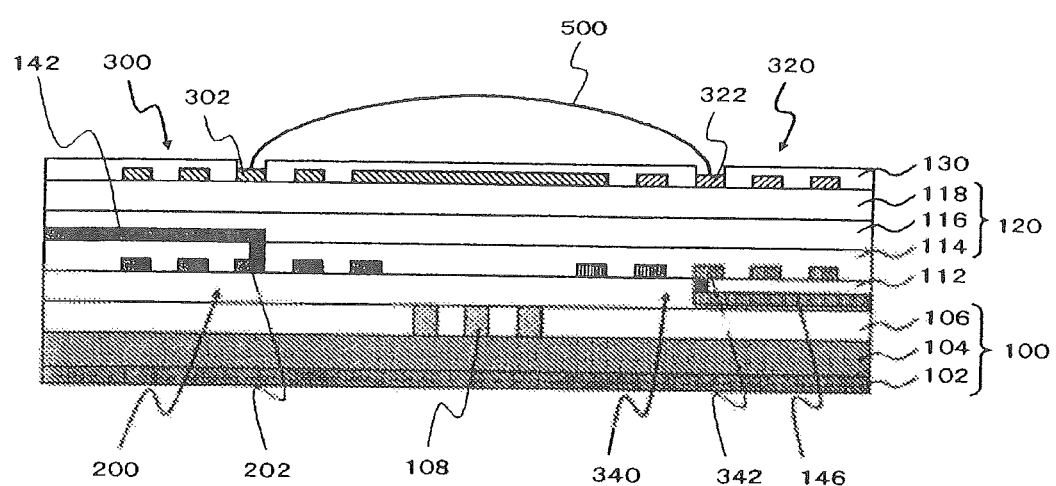
FIG. 15 is a cross-sectional view showing a circuit device according to a tenth embodiment.

FIG. 15 is a cross-sectional view showing a circuit device according to a tenth embodiment. This circuit device has the same structure as that of the ninth embodiment, except that the escape routing 146 is provided under the insulating layer 112. In the case where the silicon layer 106 includes a transistor (not shown), the escape routing 146 is formed in the same layer that includes the gate electrode of the transistor. In this case, the escape routing 146 is constituted of, for example, a polysilicon interconnect or a metal interconnect.

This embodiment also provides the same advantageous effects as those offered by the eighth embodiment. Also, since the escape routing 146 is provided in an upper layer than the silicon layer 106, the minimum spacing between the third receiving inductor 340 and the interconnect connected thereto, and the second receiving inductor 320 can be increased, to thereby improve the withstand voltage therebetween. Also, in the case where the escape routing 146 is constituted of the polysilicon interconnect, although the resistance of the escape routing 146 is increased, this does not incur any disadvantage since the receiving circuit detects the received signal based on the voltage, not the current.

Figure 16:
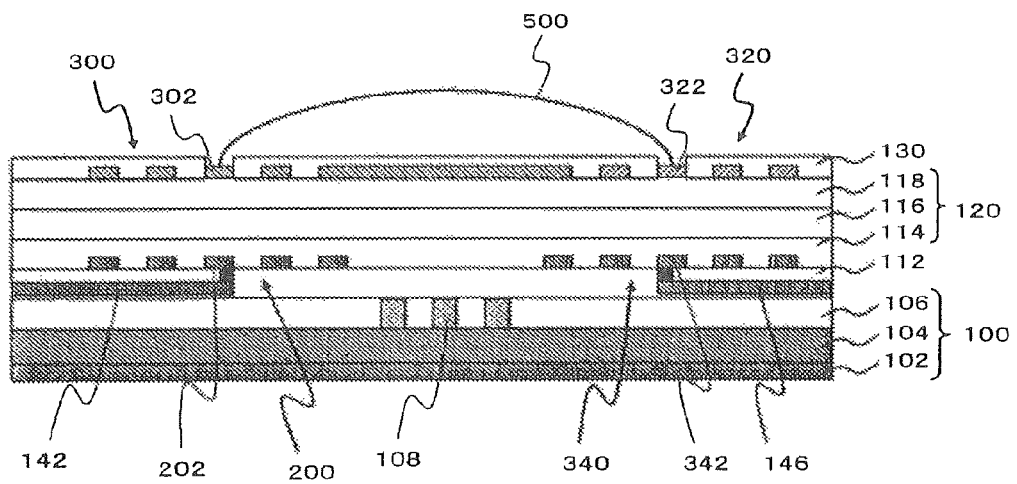
FIG. 16 is a cross-sectional view showing a circuit device according to an eleventh embodiment.

FIG. 16 is a cross-sectional view showing a circuit device according to an eleventh embodiment. This circuit device has the same structure as that of the tenth embodiment, except that the first escape routing 142 is located under the insulating layer 112 like the escape routing 146.

This embodiment also provides the same advantageous effects as those offered by the eighth embodiment. Also, since the escape routing 142 is provided in an upper layer than the silicon layer 106, the minimum spacing between the first transmitting inductor 200 and the interconnect connected thereto, and the first receiving inductor 300 can be increased, to thereby improve the withstand voltage therebetween.

Figure 17:
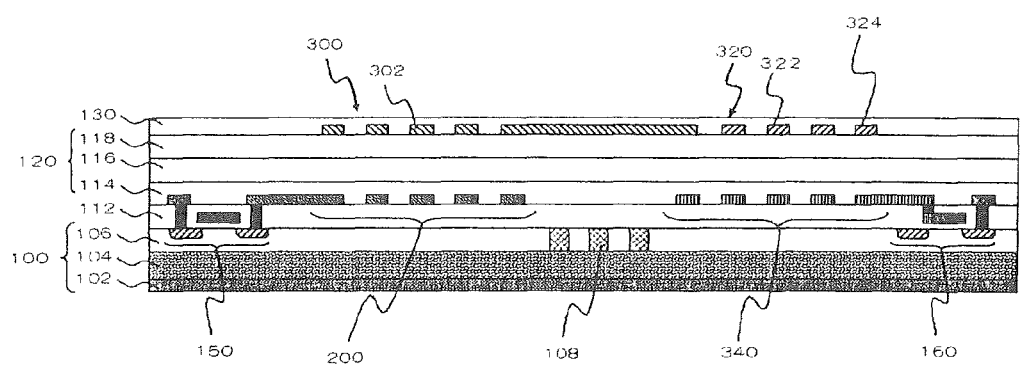
FIG. 17 is a cross-sectional view showing a circuit device according to a twelfth embodiment.

FIG. 17 is a cross-sectional view showing a circuit device according to a twelfth embodiment. This circuit device has the same structure as that of the ninth, the tenth, or the eleventh embodiment, except that the substrate 100 includes a transmitting circuit and a receiving circuit. The transmitting circuit includes a transistor 150, and the receiving circuit includes a transistor 160. It is to be noted that the wire 500, the first escape routing 142, and the escape routing 146 shown in FIG. 12 and others are not shown in FIG. 17.

In this embodiment also, the region of the silicon layer 106 including a portion under the first transmitting inductor 200 and the first receiving inductor 300, and the region thereof including a portion under the third receiving inductor 340 and the second receiving inductor 320 are insulated.

The transistor 150 is located in the region of the silicon layer 106 including the portion under the first transmitting inductor 200 and the first receiving inductor 300. The transistor 150 is a part of the transmitting circuit and the source is electrically connected, for example, to the first transmitting inductor 200. The transistor 160 is located in the region of the silicon layer 106 including the portion under the second receiving inductor 320 and the third receiving inductor 340. The transistor 160 is a part of the receiving circuit, and the gate electrode is electrically connected, for example, to the third receiving inductor 340.

This embodiment also provides the same advantageous effects as those offered by the ninth, the tenth, or the eleventh embodiment. Also, since the substrate 100 includes the transmitting circuit and the receiving circuit, the circuit device including the transmitting circuit and the receiving circuit can be made smaller in dimensions.

Figure 18:
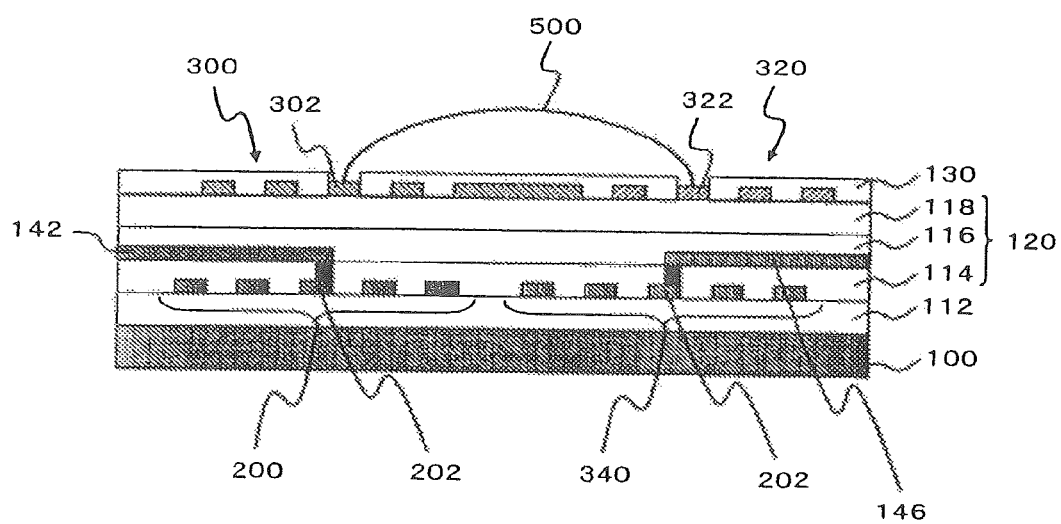
FIG. 18 is a cross-sectional view showing a circuit device according to a thirteenth embodiment.

FIG. 18 is a cross-sectional view showing a circuit device according to a thirteenth embodiment. This circuit device has the same structure as that of the eighth embodiment, except that the interconnect pattern of the first transmitting inductor 200 and that of the first receiving inductor 300 are shifted from each other in a plan view, and the interconnect pattern of the second receiving inductor 320 and that of the third receiving inductor 340 are shifted from each other in a plan view.

This embodiment also provides the same advantageous effects as those offered by the eighth embodiment. Also, since the interconnect pattern of the first transmitting inductor 200 and that of the first receiving inductor 300 are shifted from each other in a plan view, the minimum spacing between the first transmitting inductor 200 and the interconnect connected thereto, and the first receiving inductor 300 and the interconnect connected thereto can be increased, to thereby improve the withstand voltage therebetween. Further, since the interconnect pattern of the second receiving inductor 320 and that of the third receiving inductor 340 are shifted from each other in a plan view, the minimum spacing between the second receiving inductor 320 and the interconnect connected thereto, and third receiving inductor 340 and the interconnect connected thereto can be increased, to thereby improve the withstand voltage therebetween.

Figure 19:
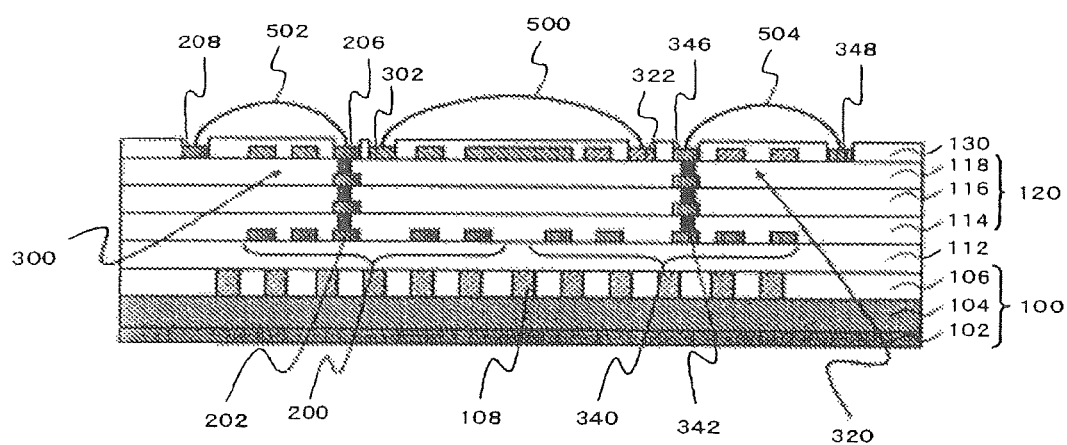
FIG. 19 is a cross-sectional view showing a circuit device according to a fourteenth embodiment.

FIG. 19 is a cross-sectional view showing a circuit device according to a fourteenth embodiment. This circuit device has the same structure as that of the ninth embodiment, except for the following features.

Instead of the first escape routing 142 shown in FIG. 13, a wire 502, an electrode 206, and a via plug connecting the electrode 206 and the inner end portion 202 of the first transmitting inductor 200, are provided. The electrode 206 is provided in the same layer that includes the first receiving inductor 300, and is exposed in the opening formed on the cover layer 130. The electrode 206 is located inside the first receiving inductor 300.

Also, instead of the first escape routing 146 shown in FIG. 13, a wire 504, an electrode 346, and a via plug connecting the electrode 346 and the inner end portion 342 of the third receiving inductor 340, are provided. The electrode 346 is provided in the same layer that includes the second receiving inductor 320, and is exposed in the opening formed on the cover layer 130. The electrode 346 is located inside the second receiving inductor 320.

Between the electrode 206 and the end portion 202 of the first transmitting inductor 200, as well as between the electrode 346 and the end portion 342 of the third receiving inductor 340, a plurality of layers is provided, which includes a via plug and a conductive pattern connecting the electrode 206 and the end portion 202, and a via plug and a conductive pattern connecting the electrode 346 and the end portion 342.

The wire 502 connects the electrode 206 and the electrode 208, and the wire 504 connects the electrode 346 and the electrode 348. The electrodes 208, 348 are provided in the same layer that includes the first receiving inductor 300 and the second receiving inductor 320, and are exposed in the opening formed on the cover layer 130. The electrode 208 is located outside the first receiving inductor 300, and connected to the transmitting circuit (not shown). The electrode 348 is located outside the second receiving inductor 320, and connected to the receiving circuit (not shown).

The embedded insulating layer 108 has the shape as shown in FIGS. 5A and 5B related to the third embodiment.

Figure 20:
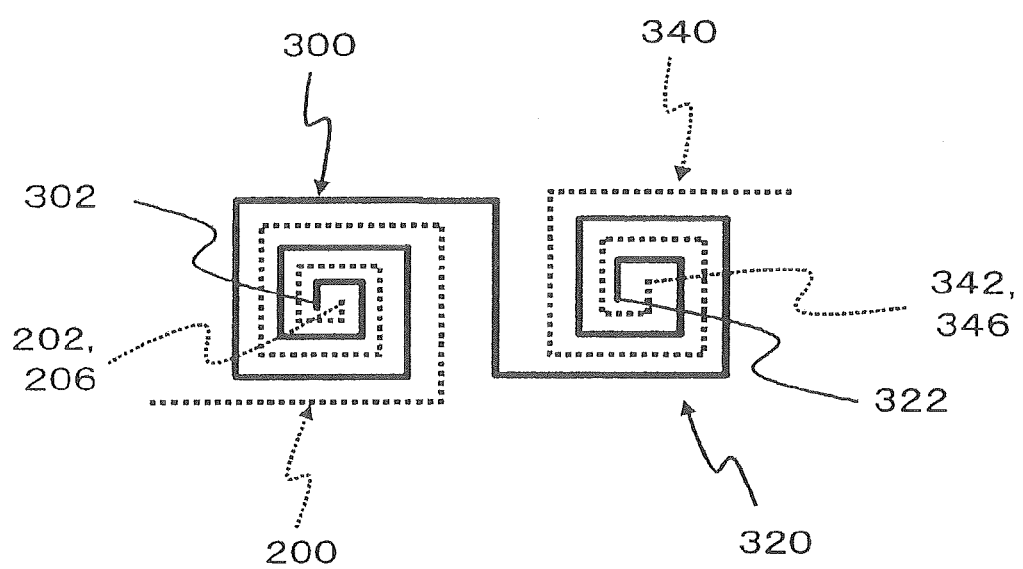
FIG. 20 is a plan view showing a positional relationship among the first transmitting inductor, the first receiving inductor, the second receiving inductor, and a third receiving inductor.

FIG. 20 is a plan view showing a positional relationship among the first transmitting inductor 200, the first receiving inductor 300, the second receiving inductor 320, and the third receiving inductor 340. As shown therein, the conductive pattern of the first transmitting inductor 200 and that of the first receiving inductor 300 do not overlap, and neither do the conductive pattern of the second receiving inductor 320 and that of the third receiving inductor 340. Also, the inner end portion 202 of the first transmitting inductor 200 and the inner end portion 302 of the first receiving inductor 300 do not overlap, and neither do the inner end portion 322 of the second receiving inductor 320 and the inner end portion 342 of the third receiving inductor 340.

This embodiment also provides the same advantageous effects as those offered by the ninth embodiment. Also, increasing the distance between the electrode 206 and the first receiving inductor 300 leads to an increase in minimum spacing between the first transmitting inductor 200 and the interconnect connected thereto, and the first receiving inductor 300 and the interconnect connected thereto, resulting in improved withstand voltage therebetween. Also, increasing the distance between the electrode 346 and the second receiving inductor 320 leads to an increase in minimum spacing between the third receiving inductor 340 and the interconnect connected thereto, and the second receiving inductor 320 and the interconnect connected thereto, resulting in improved withstand voltage therebetween.

Also, since the embedded insulating layer 108 has the shape as shown in FIGS. 5A and 5B related to the third embodiment, the generation of eddy current on the substrate 100 can be suppressed.

Figure 21:
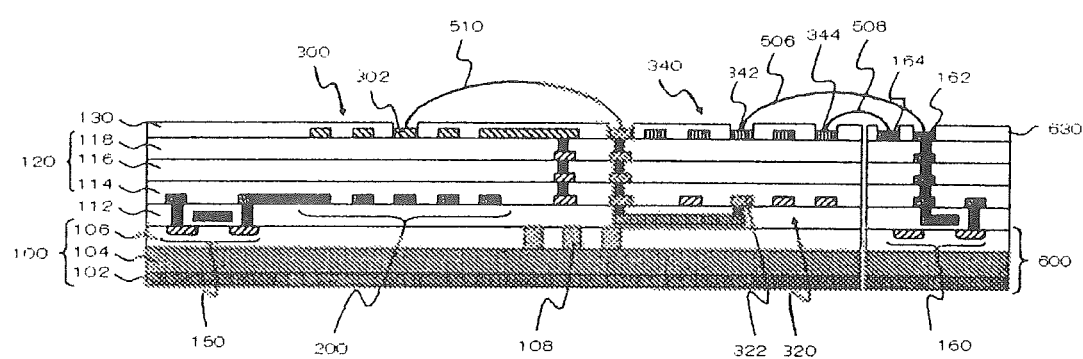
FIG. 21 is a cross-sectional view showing a circuit device according to a fifteenth embodiment.

FIG. 21 is a cross-sectional view showing a circuit device according to a fifteenth embodiment. This circuit device has the same structure as that of the twelfth embodiment, except for the following features.

The third receiving inductor 340 is located in the same layer that includes the first receiving inductor 300, and the second receiving inductor 320 is located below the third receiving inductor 340, for example in the same layer that includes the first transmitting inductor 200. The first receiving inductor 300 and the second receiving inductor 320 have an end portion thereof (for example, the respective outer end portions) connected to each other through a via plug and a conductive pattern formed therebetween, and the other end portion thereof (for example, the respective inner end portions) connected to each other through a via plug and a conductive pattern formed therebetween and a wire 510. Here, the inner end portion 322 of the second receiving inductor 320 may be led out to a different position through an interconnect in a lower layer than the layer including the second receiving inductor 320 (for example, interconnect in the same layer that includes the gate electrode of the transistor 150).

The receiving circuit (including the transistor 160) is provided in a substrate 600. The substrate 600 is for example a SOI substrate, but may also be a semiconductor substrate such as a silicon substrate. One of the electrodes (for example, the gate electrode) of the transistor 160 is connected to an electrode 162 in an upper most interconnect layer, through the via plug and the conductive pattern formed in the respective layers on the substrate 600. The electrode 162, and another electrode 164 in the same layer including the electrode 162 are exposed in an opening formed on a cover layer 630. The electrode 164 is also connected to the receiving circuit.

The electrodes 162, 164 are connected to the end portions 342, 344 of the third receiving inductor 340 through wires 506, 508, respectively. Here, the electrode 162 may be connected to the end portion 344, and the electrode 164 may be connected to the end portion 342.

This embodiment also provides the same advantageous effects as those offered by the ninth embodiment. Also, the receiving circuit and the third receiving inductor 340 formed in another substrate 600 can be electrically connected.

Also, the first transmitting inductor 200 is located below the first receiving inductor 300. Since the silicon layer 106 includes the transmitting circuit, the reference potential of the first transmitting inductor 200 is not significantly different from the substrate potential of the silicon layer 106. Such configuration more effectively suppresses the emergence of dielectric breakdown between the silicon layer 106 and either inductor, than in the case where the first receiving inductor 300 is located below the first transmitting inductor 200.

Further, since the inner end portion 322 of the second receiving inductor 320 is led out to outside through the interconnect in a lower layer than the layer including the second receiving inductor 320, the minimum spacing between the second receiving inductor 320 and the interconnect connected thereto, and the third receiving inductor 340 and the interconnect connected thereto can be increased, to thereby improve the withstand voltage therebetween.

In this embodiment, the transmitting circuit (including the transistor 150) may be provided in the substrate 600, and the receiving circuit (including the transistor 160) may be provided in a region of the substrate 100 including a portion below the second receiving inductor 320. In this case, it is preferable that the third receiving inductor 340 is located below the second receiving inductor 320. Such configuration suppresses the emergence of dielectric breakdown between the silicon layer 106 and either inductor.

Figure 22:
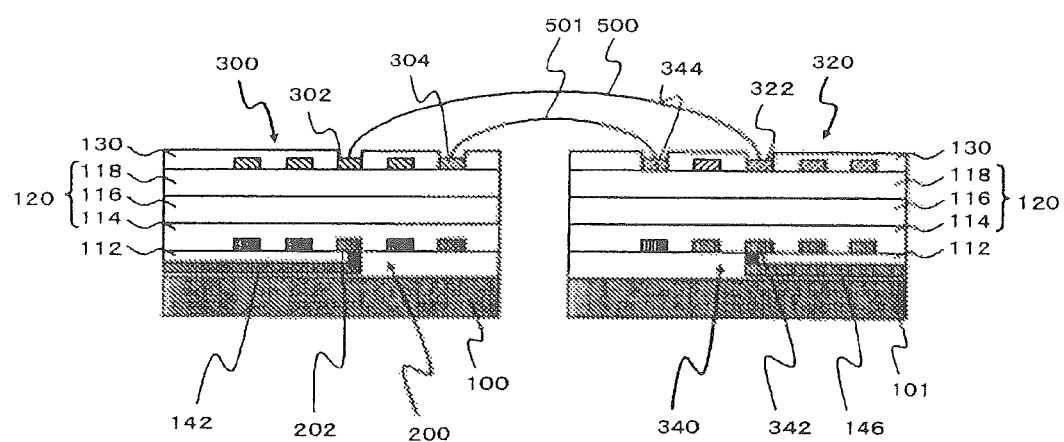
FIG. 22 is a cross-sectional view showing a circuit device according to a sixteenth embodiment.

FIG. 22 is a cross-sectional view showing a circuit device according to a sixteenth embodiment. This circuit device has the same structure as that of the eleventh embodiment, except for the following features. The substrate 100 includes the first transmitting inductor 200 and the first receiving inductor 300, and the second receiving inductor 320 and the third receiving inductor 340 are provided in a substrate 101. The substrates 100, 101 are both semiconductor substrates such as a silicon substrate, but may also be the SOI substrates. The outer end portion 304 of the first receiving inductor 300 and the outer end portion 324 of the second receiving inductor 320 are both exposed in the opening formed on the cover layer 130, and connected to each other through a wire 501.

Figure 23A:
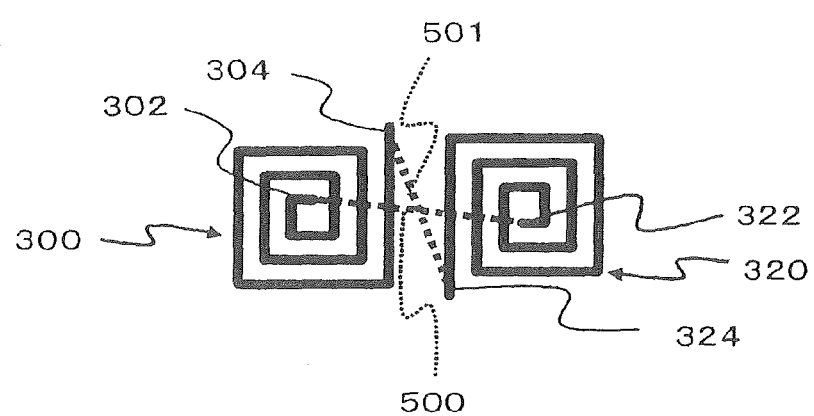
FIGS. 23A and 23B are plan views each showing a shape of the first receiving inductor and the second receiving inductor of the circuit device shown in FIG. 22.
Figure 23B:
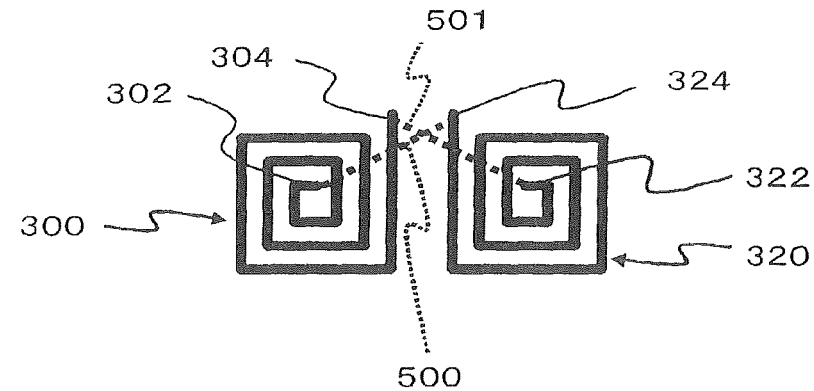

FIGS. 23A and 23B are plan views each showing the shape of the first receiving inductor 300 and the second receiving inductor 320 of the circuit device shown in FIG. 22.

FIG. 23A depicts an example corresponding to FIG. 22. The first receiving inductor 300 and the second receiving inductor 320 are wound in the same direction. The inner end portions 302, 322 are connected to each other through the wire 500, and the outer end portions 304, 324 are connected to each other through the wire 501.

FIG. 23B depicts an example different from FIG. 22. The first receiving inductor 300 and the second receiving inductor 320 are wound in the opposite directions. The wire 500 connects the inner end portion 302 of the first receiving inductor 300 and the outer end portion 324 of the second receiving inductor 320. The wire 501 connects the outer end portion 304 of the first receiving inductor 300 and the inner end portion 322 of the second receiving inductor 320. Here, the wire 500 may mutually connect the end portions 302, 324 and the wire 501 may mutually connect the end portions 304, 322.

This embodiment also provides the same advantageous effects as those offered by the eleventh embodiment. Also, providing the second receiving inductor 320 and the third receiving inductor 340 on the different substrate from the substrate on which the first transmitting inductor 200 and the first receiving inductor 300 are provided allows suppressing the emergence of dielectric breakdown between the first transmitting inductor 200 and the third receiving inductor 340, even though the reference potential of the transmitted signal and that of the received signal are largely different.

Figure 24:
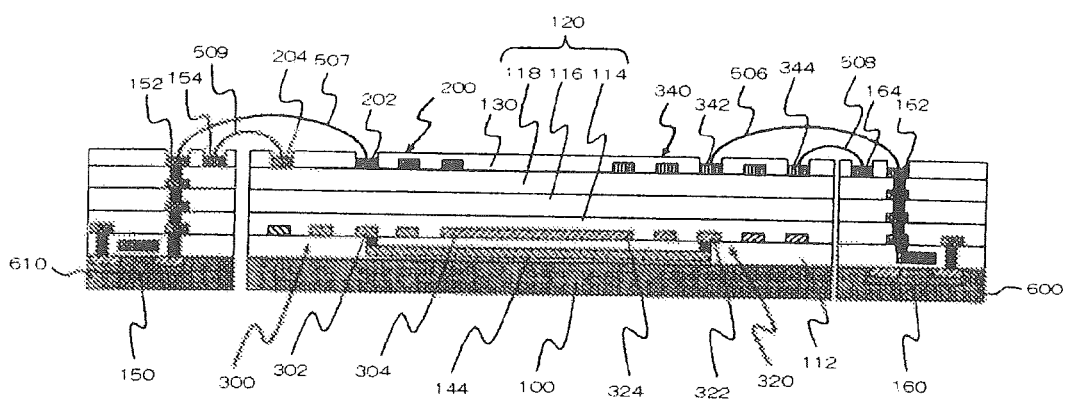
FIG. 24 is a cross-sectional view showing a circuit device according to a seventeenth embodiment.

FIG. 24 is a cross-sectional view showing a circuit device according to a seventeenth embodiment. This circuit device has the same structure as that of the sixth embodiment, except for the following features.

The first transmitting inductor 200 and the third receiving inductor 340 are located on the surface of the insulating layer 118, and the first receiving inductor 300 and the second receiving inductor 320 are located on the surface of the insulating layer 112. The transmitting circuit is provided in a substrate 610, and the receiving circuit is provided in the substrate 600. The transmitting circuit includes the transistor 150, and the receiving circuit includes the transistor 160. The substrates 100, 600, 610 are, for example, semiconductor substrates such as a silicon substrate, but may also be the SOI substrates.

The cover layer 130 includes an opening in which the end portions 202, 204 of the first transmitting inductor 200 are exposed, and an opening in which the end portions 342, 344 of the third receiving inductor 340 are exposed. The end portions 202, 204 are connected to the electrodes 152, 154 formed in the substrate 610, through wires 507, 509 respectively, and the end portions 342, 344 are connected to the electrode 162, 164 formed in the substrate 600, through the wires 506, 508 respectively. The electrodes 152, 154 are connected to the transmitting circuit, and the electrode 162, 164 are connected to the receiving circuit.

The outer end portion 304 of the first receiving inductor 300 is directly connected to the outer end portion 324 of the second receiving inductor 320, and the inner end portion 302 of the first receiving inductor 300 is connected to the inner end portion 322 of the second receiving inductor 320 through the via plug and the second escape routing 144. The second escape routing 144 is provided in a lower layer than the layer including the first receiving inductor 300 and the second receiving inductor 320. In the case where the substrate 100 includes the transistor, the second escape routing 144 is located in the same layer including, for example, the gate electrode of the transistor.

This embodiment also provides the same advantageous effects as those offered by the sixth embodiment. Also, since the first transmitting inductor 200 and the third receiving inductor 340 are located on the surface of the insulating layer 118, the emergence of dielectric breakdown between the substrate 100 and either the first transmitting inductor 200 or the third receiving inductor 340 can be suppressed, even though the substrate potential of the substrate 100 is largely different from the reference potential of the transmitted signal, or from that of the received signal.

Although the embodiments of the present invention have been described referring to the drawings, it is to be understood that those are merely exemplary and that various other structures may be adopted.

It is apparent that the present invention is not limited to the above embodiment, and may be modified and changed without departing from the scope and spirit of the invention.

What is claimed is:

1. A circuit device, comprising:
   a semiconductor substrate;
   a first inductor provided over said semiconductor substrate;
   a second inductor provided over said semiconductor substrate and coupled to said first inductor;
   a third inductor provided over said semiconductor substrate and located in a region overlapping with said first inductor when viewed from a direction perpendicular to said semiconductor substrate, said third inductor being positioned at a region between said semiconductor substrate and said first inductor; and
   a fourth inductor provided over said semiconductor substrate and overlapping with said second inductor when viewed from a direction perpendicular to said semiconductor substrate, said fourth inductor being positioned at a region between said semiconductor substrate and said second inductor,
   wherein said first inductor comprises a first inner end portion and a first outer end portion,
   wherein said second inductor comprises a second inner end portion and a second outer end portion,
   wherein said third inductor comprises a third inner end portion,
   wherein said fourth inductor comprises a fourth inner end portion,
   wherein said first inductor is wound in a first direction from said first inner end portion to said first outer end portion,
   wherein said second inductor is wound in the first direction from said second inner end portion to said second outer end portion,
   wherein said first outer end portion and said second outer end portion are coupled to each other, and
   wherein said third inner end portion and said fourth inner end portion are not coupled to each other.

2. The circuit device according to claim 1, wherein said first inner end portion and said second inner end portion are coupled to each other.

3. The circuit device according to claim 1, further comprising:
   a first interconnect provided over said semiconductor substrate and coupled to said third inductor; and
   a second interconnect provided over said semiconductor substrate and coupled to said fourth inductor.

* * * * *